(12) United States Patent
Lee

(10) Patent No.: US 12,396,103 B2
(45) Date of Patent: Aug. 19, 2025

(54) DEVICE FOR ETCHING THE PERIPHERY EDGE OF A SUBSTRATE AND METHOD FOR CONTROLLING ETCHING THEREOF

(71) Applicant: DEVICE CO., LTD., Cheonan-si (KR)

(72) Inventor: Taek Youb Lee, Chungcheongnam-do (KR)

(73) Assignee: DEVICE CO., LTD., Chungcheongnam-do (KR)

( * ) Notice: Subject to any disclaimer, the term of this patent is extended or adjusted under 35 U.S.C. 154(b) by 212 days.

(21) Appl. No.: 17/729,054

(22) Filed: Apr. 26, 2022

(65) Prior Publication Data
US 2023/0269881 A1 Aug. 24, 2023

(30) Foreign Application Priority Data

Feb. 21, 2022 (KR) .................. 10-2022-0022448

(51) Int. Cl.
*H05K 3/06* (2006.01)
(52) U.S. Cl.
CPC ............. *H05K 3/068* (2013.01); *H05K 3/067* (2013.01); *H05K 2203/086* (2013.01); *H05K 2203/1509* (2013.01); *H05K 2203/1554* (2013.01)
(58) Field of Classification Search
None
See application file for complete search history.

(56) References Cited

U.S. PATENT DOCUMENTS

| | | | |
|---|---|---|---|
| 6,040,011 A | 3/2000 | Yudovsky et al. | |
| 6,309,981 B1* | 10/2001 | Mayer | H01L 21/76877 257/E21.309 |
| 6,333,275 B1* | 12/2001 | Mayer | H01L 21/6708 438/747 |
| 2002/0050244 A1* | 5/2002 | Engesser | H01L 21/67075 118/503 |
| 2004/0105738 A1 | 6/2004 | Ahn et al. | |
| 2005/0263066 A1 | 12/2005 | Lubomirsky et al. | |
| 2008/0128088 A1 | 6/2008 | Junn et al. | |
| 2008/0280453 A1* | 11/2008 | Koelmel | H01L 21/67115 438/758 |
| 2009/0181546 A1* | 7/2009 | Katoh | H01L 21/6708 438/745 |
| 2009/0186488 A1* | 7/2009 | Takeo | H01L 21/67075 438/748 |

FOREIGN PATENT DOCUMENTS

KR 1020200009397 A 1/2020

* cited by examiner

*Primary Examiner* — Allan W. Olsen
(74) *Attorney, Agent, or Firm* — Blank Rome LLP

(57) ABSTRACT

The present invention relates to a substrate edge etching apparatus including: a substrate support assembly having a horizontally rotatable chuck base, chuck pins disposed on top of the chuck base to support a substrate, a purge gas inlet hole extending from an underside center of the chuck base to an interior of the chuck base in an upward and downward direction thereof, and a purge gas outlet hole extending radially from the purge gas inlet hole and then extending upwardly to penetrate top of the chuck base; a purge gas supply assembly for supplying a purge gas to the purge gas inlet hole; a chemical liquid supply unit for supplying a chemical liquid to top of the substrate; a bowl assembly having bowls surrounding the periphery of the substrate support assembly and configured to be able to ascend and descend; and a fan filter unit spaced apart from top of the substrate support assembly.

3 Claims, 7 Drawing Sheets

PRIOR ART

DEVICE FOR ETCHING THE PERIPHERY EDGE OF A SUBSTRATE AND METHOD FOR CONTROLLING ETCHING THEREOF

CROSS REFERENCE TO RELATED APPLICATION OF THE INVENTION

The present application claims the benefit of Korean Patent Application No. 10-2022-0022448 filed in the Korean Intellectual Property Office on Feb. 21, 2022, the entire contents of which are incorporated herein by reference.

BACKGROUND OF THE INVENTION

Field of the Invention

The present invention relates to a substrate edge etching apparatus and a method for controlling etching thereof, and more specifically, to a substrate edge etching apparatus and a method for controlling etching thereof that are capable of etching a peripheral edge of a substrate by means of the application of a chemical liquid thereto, in a state where a treatment surface of the substrate, on which a circuit pattern is formed, is facingly placed on top thereof, while an etched amount is being controlled.

Background of the Related Art

Generally, a process of forming a circuit pattern on a substrate includes various steps such as oxidation, photolithography, etching, deposition, metallization, and the like, which are performed on one surface of the substrate.

While such steps are being performed, all kinds of foreign substances are attached to a peripheral edge of the substrate to the form of layers.

Accordingly, the peripheral edge of the substrate cannot be utilized in forming the circuit pattern, and of course, it actually has no circuit pattern formed thereon.

If the peripheral edge of the substrate is fixed by chuck pins to perform the circuit pattern formation process, however, the layers of foreign substances attached to the peripheral edge of the substrate may be cracked, so that the foreign substances may enter the inside of the substrate, and otherwise, particles generated from the foreign substances may invade the inside of the substrate, thereby making it difficult to form the circuit pattern on the substrate.

To prevent such problems from occurring, there is a need to in advance etch and remove the layers of foreign substances formed on the peripheral edge of the substrate, and FIG. 1 schematically shows a process of etching a peripheral edge of a substrate.

The substrate edge etching is largely divided into wet etching and dry etching.

The wet etching is performed by protecting a portion to be not etched on top of a substrate by means of a mask, submerging the substrate into a chemical liquid (etching liquid) filled in a bath, and etching the peripheral edge of the substrate.

The dry etching is performed by generating plasma, exciting reactive gas in the plasma, and etching the peripheral edge of the substrate.

If a relatively wide peripheral edge of the substrate is etched, a real area on which a circuit pattern is formed becomes small inefficiently, and contrarily, if a relatively narrow peripheral edge of the substrate is etched, the layers of foreign substances attached to the peripheral edge of the substrate are partially broken when the peripheral edge of the substrate is fixed by the chuck pins. Accordingly, the peripheral edge of the substrate has to be etched in an appropriate width.

The conventional wet etching has the process of protecting the portion where the circuit pattern is formed by means of the mask and the process of removing the mask after etching, so that disadvantageously, etching time may be extended and the etching may be performed in a complicated configuration.

If it is desired to adjust a width of an etched portion, further, the mask has to be frequently changed into masks with different diameters, which causes the etching to be performed inconveniently and needs long etching time.

SUMMARY OF THE INVENTION

Accordingly, the present invention has been made in view of the above-mentioned problems occurring in the related art, and it is an object of the present invention to provide a substrate edge etching apparatus and a method for controlling etching thereof that are capable of rotating a chuck base to perform etching, in a state where a substrate is reversely located on the chuck base to allow a treatment surface on which a circuit pattern is formed to be facingly on top of the chuck base, while a chemical liquid is being supplied to top of the substrate and a purge gas such as nitrogen gas N2 and the like is being supplied to underside of the substrate, thereby keeping a given etched amount on the peripheral edge of the substrate.

To accomplish the above-mentioned objects, according to one aspect of the present invention, there is provided a substrate edge etching apparatus including: a substrate support assembly having a horizontally rotatable chuck base, chuck pins disposed on top of the chuck base to support a substrate, a purge gas inlet hole extending from an underside center of the chuck base to an interior of the chuck base in an upward and downward direction thereof, and a purge gas outlet hole extending radially from the purge gas inlet hole and then extending upwardly to penetrate top of the chuck base; a purge gas supply assembly for supplying a purge gas to the purge gas inlet hole; a chemical liquid supply unit for supplying a chemical liquid to top of the substrate; a bowl assembly having bowls surrounding the periphery of the substrate support assembly and configured to be able to ascend and descend; and a fan filter unit spaced apart from top of the substrate support assembly.

To accomplish the above-mentioned objects, according to another aspect of the present invention, there is provided a method for controlling etching of the substrate edge etching apparatus according to one aspect of the present invention, the method including the step of controlling any one or more of a rotational speed of the substrate support assembly, a flow rate of the purge gas supplied from the purge gas supply assembly, a flow rate of the chemical liquid supplied from the chemical liquid supply unit, and a height to the top of the bowl from top of the substrate to thus adjust an etched amount.

According to the present invention, desirably, if the etched amount is less than a given reference value, the rotational speed of the substrate support assembly is decreased, and if the etched amount is more than the given reference value, the rotational speed of the substrate support assembly is increased, so that the etched amount corresponds to the given reference value.

According to the present invention, desirably, if the etched amount is less than a given reference value, the flow rate of the purge gas is decreased, and if the etched amount is more than the given reference value, the flow rate of the purge gas is increased, so that the etched amount corresponds to the given reference value.

According to the present invention, desirably, if the etched amount is less than a given reference value, the flow rate of the chemical liquid is increased, and if the etched amount is more than the given reference value, the flow rate of the chemical liquid is decreased, so that the etched amount corresponds to the given reference value.

According to the present invention, desirably, if the etched amount is less than a given reference value, the height to the top of the bowl from top of the substrate is increased to decrease a flow speed of air passing between the bowls and the peripheral edge of the substrate, and if the etched amount is more than the given reference value, the height to the top of the bowl from top of the substrate is decreased to increase the flow speed of air, so that the etched amount corresponds to the given reference value.

According to the present invention, desirably, any one or more of the rotational speed of the substrate support assembly, the flow rate of the purge gas supplied from the purge gas supply assembly, the flow rate of the chemical liquid supplied from the chemical liquid supply unit, and the height to the top of the bowl from top of the substrate are controlled to thus adjust the number of etched portions invaded unevenly on the periphery of the underside of the substrate.

According to the present invention, desirably, the number of etched portions invaded is adjusted to two or less.

BRIEF DESCRIPTION OF THE DRAWINGS

The above and other objects, features and advantages of the present invention will be apparent from the following detailed description of the embodiments of the invention in conjunction with the accompanying drawings, in which.

DETAILED DESCRIPTION OF THE PREFERRED EMBODIMENT

Hereinafter, an embodiment of the present invention will be explained in detail with reference to the attached drawings.

Figure 1:
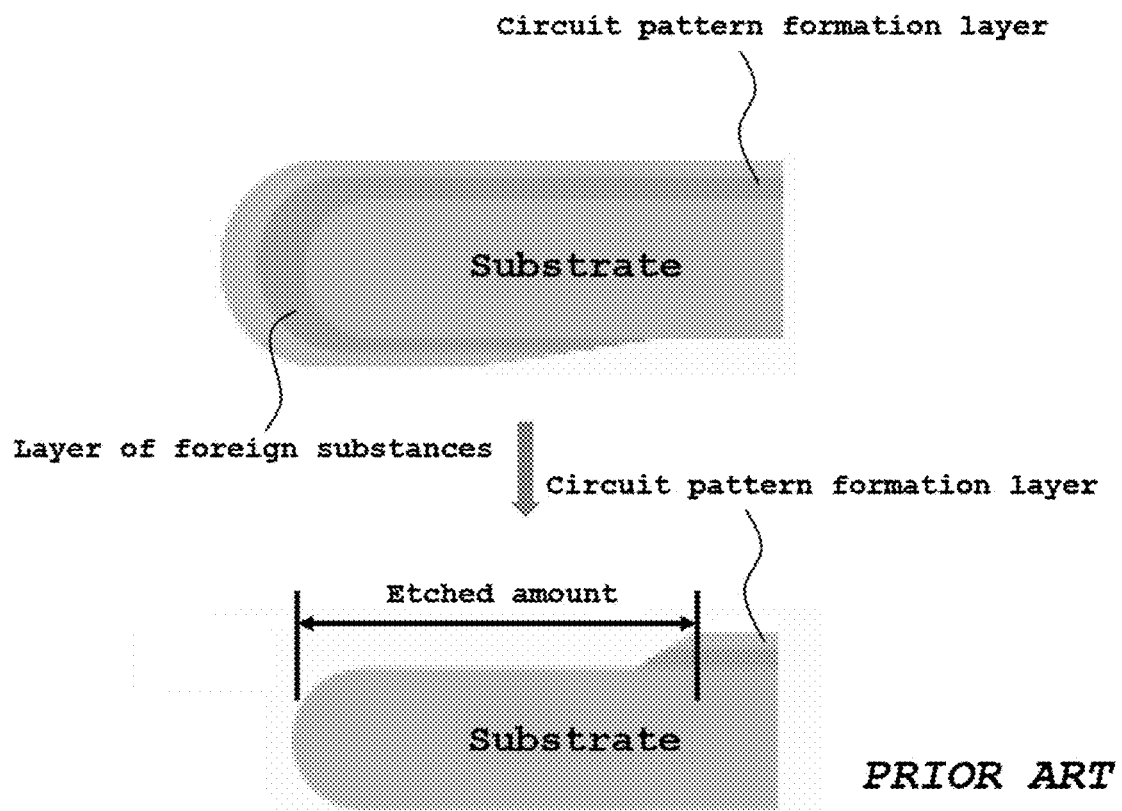
FIG. 1 is a schematic view showing a process of etching an edge of a substrate.
Figure 2:
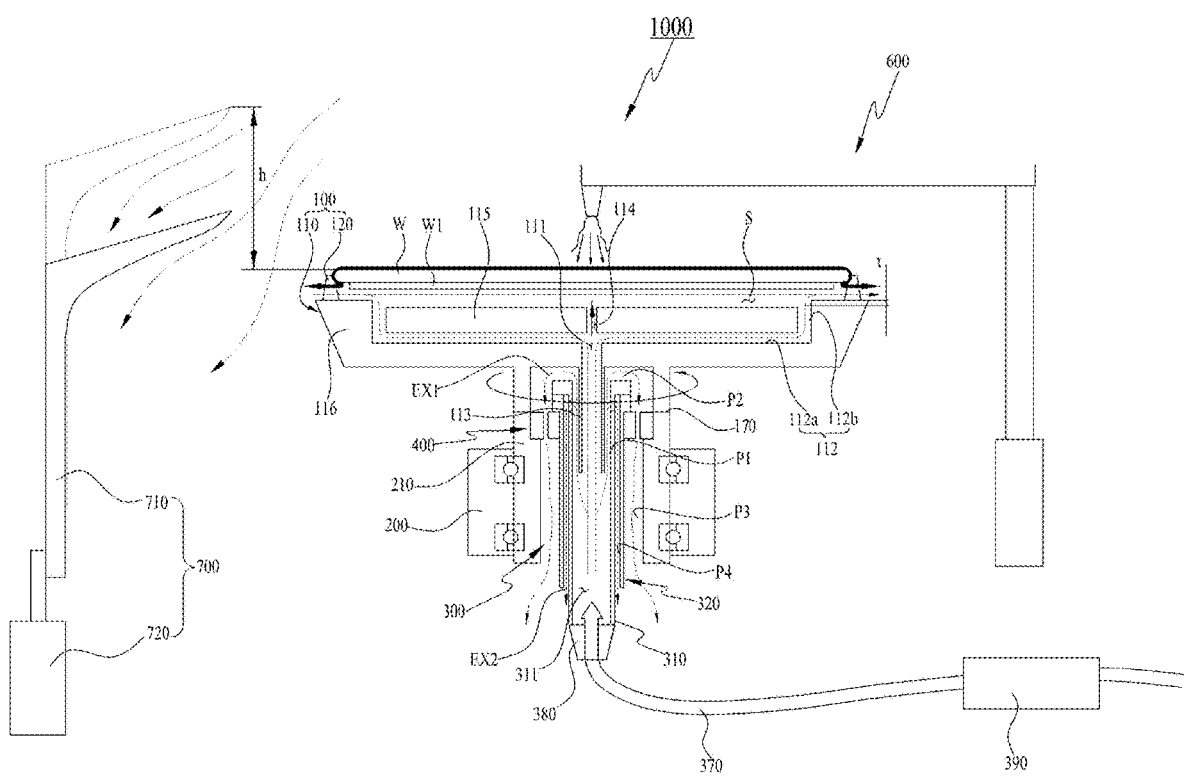
FIG. 2 is a longitudinal sectional view showing a substrate edge etching apparatus according to the present invention.
Figure 3:
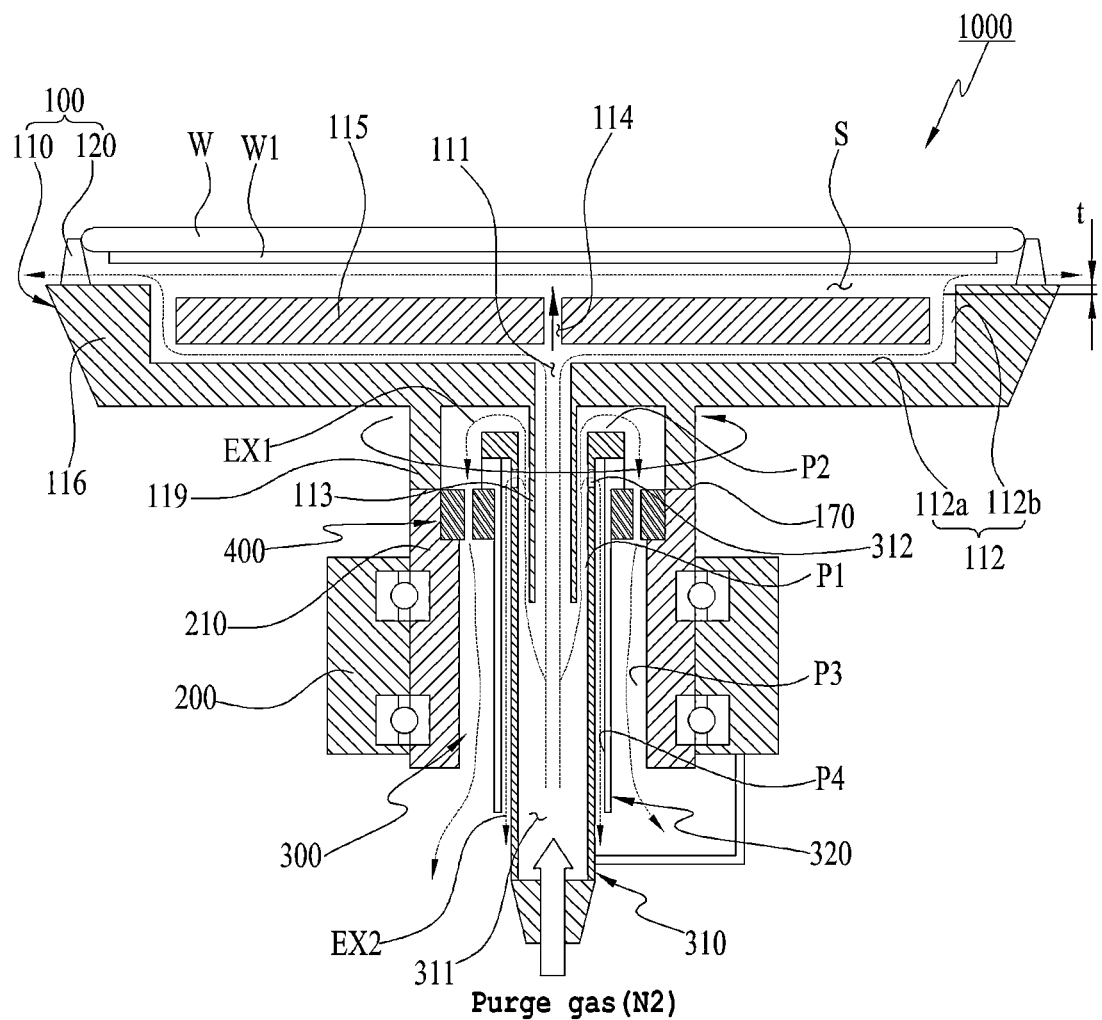
FIG. 3 is a longitudinal sectional view showing a substrate support assembly and a purge gas supply assembly of FIG. 2.

As shown in FIGS. 2 and 3, a substrate edge etching apparatus 1000 includes: a substrate support assembly 100 having a horizontally rotatable chuck base 110, chuck pins 120 disposed on top of the chuck base 110 to support a substrate W, a purge gas inlet hole 111 extending from an underside center of the chuck base 110 to an interior of the chuck base 110 in an upward and downward direction thereof, and a purge gas outlet hole 112 extending radially from the purge gas inlet hole 111 and then extending upwardly to penetrate top of the chuck base 110; a purge gas supply assembly 300 for supplying a purge gas to the purge gas inlet hole 111; a chemical liquid supply unit 600 for supplying a chemical liquid to top of the substrate W; a bowl assembly 700 having bowls 710 surrounding the periphery of the substrate support assembly 100 and configured to be able to ascend and descend; and a fan filter unit (not shown) spaced apart from top of the substrate support assembly 100.

Under the above-mentioned configuration, in a state where the substrate W is reversely located on the chuck base 110 to allow a treatment surface on which a circuit pattern formation layer W1 is formed to be facingly on top of the chuck base 110, the chuck base 110 rotates. In this case, the chemical liquid is supplied to top (that is, underside) of the substrate W from the chemical liquid supply unit 600, and the purge gas such as nitrogen gas N2 and the like is supplied to underside (that is, the treatment surface) of the substrate W from the purge gas supply assembly 300, so that the chemical liquid can be prevented from being introduced into the inside of the substrate W from the peripheral edge of the substrate W.

The purge gas is introduced from the purge gas inlet hole 111, passes through the purge gas outlet hole 112, and is thus exhausted through a space between the substrate W and top of the chuck base 110.

If the chemical liquid is supplied to top of the substrate W, the chemical liquid somewhat enters a radial inside of the substrate W from the periphery of the substrate W by means of surface tension thereof and is then discharged to the outside of the substrate W by means of various reasons, so that the etching of the peripheral edge of the substrate W is cleanly performed.

The purge gas is a gas supplied to prevent particles in the air from entering the circuit pattern forming layer W1 of the substrate W, and representatively, an inert gas such as N2 may be used as the purge gas.

The bowl assembly 700 serves to receive the chemical liquid scattering from the substrate W and the chuck base 110 and discharge the received chemical liquid and includes the bowls 710 and driving units 720 such as motors or pressure cylinders to movably ascend and descend the bowls 710.

Further, the bowls 710 of the bowl assembly 700 are overlaid onto one another in radial directions thereof and movably ascended and descended independently of one another by means of the driving units 720 connected correspondingly to the bowls 710.

The fan filter unit (not shown) is disposed on top of a chamber (not shown) in which the substrate edge etching apparatus 1000 is accommodated and thus serves to supply external air filtered to the inside of the chamber.

Hereinafter, an explanation on parts not mentioned above will be given with reference to FIGS. 2 and 3. Before the explanation, the purge gas supply assembly 300 as will be discussed later is just one example, and accordingly, various examples of the purge gas supply assembly 300 may be provided.

In specific, the purge gas supply assembly 300 includes a purge gas guide tube 310 spaced apart from a periphery of the purge gas inlet hole 111 to surround the periphery of the purge gas inlet hole 111 in a radial direction thereof in a plan view and having a hollow hole 311 penetratingly extending in the upward and downward direction thereof in a side view and a hollow tube-shaped purge gas guide tube support shaft 320 spacedly overlaid onto top of the purge gas guide tube 310 in an outer radial direction of the purge gas guide tube 310 and adapted to mount a bearing 400 thereonto to support the driving shaft 210.

Under the above-mentioned configuration, the purge gas such as N2 and the like is introduced through the purge gas guide tube 310. Next, a given amount of the purge gas is exhausted through the purge gas inlet hole 111 and the purge gas outlet hole 112 formed on the chuck base 110 to the space between the substrate W and top of the chuck base 110, thereby performing a purge function, and simultaneously, the rest of the purge gas is exhausted to the outside in a direction distant from the substrate W through a path between the purge gas inlet hole 111 and the purge gas guide tube 310 and the bearing 400, thereby preventing external particles from entering the substrate W through the bearing 400.

In specific, the chuck base 110 has a purge gas introduction tube 113 extending downward from the underside thereof to communicate with the purge gas inlet hole 111, and if the purge gas introduction tube 113 is disposed spaced apart from the purge gas guide tube 310 inside the purge gas guide tube 310 in a radial direction thereof, the path through which the rest of the purge gas passes can be clearly defined, so that a flow rate of the purge gas is introduced dividedly in a relatively accurate way.

Under the above-mentioned configuration, a path P1 formed between the purge gas introduction tube 113 and the purge gas guide tube 310, a path P2 formed between the underside of the chuck base 110 and the top end of the purge gas guide tube 310, and a path P3 formed between the purge gas guide tube support shaft 320 and the driving shaft 210 provide a first purge gas exhaust path EX1.

As the purge gas is exhausted to the outside through the first purge gas exhaust path EX1, a flow of external air is not introduced into a purge area through the bearing 400, thereby preventing the circuit pattern formation layer W1 of the substrate W from being damaged and easily discharging the particles introduced through a connecting part 170 between the driving shaft 210 and the chuck base 110 to the outside.

The bearing 400 is formed of a rolling bearing, but it may be formed of a non-contact bearing such as a magnetic bearing.

Further, the purge gas guide tube 310 has a plurality of communication holes 312 spaced apart from one another on an upper peripheral surface thereof in a circumferential direction thereof, and accordingly, the path P1 formed between the purge gas guide tube 310 and the purge gas introduction tube 113, the plurality of communication holes 312, and a path P4 formed between the purge gas guide tube 310 and the purge gas guide tube support shaft 320 provide a second purge gas exhaust path EX2.

Under the above-mentioned configuration, the rest of the purge gas entering the path P1 between the purge gas guide tube 310 and the purge gas introduction tube 113 excepting a given amount of the purge gas passing through the first purge gas exhaust path EX1 is exhausted through the second purge gas exhaust path EX2, so that it is possible to completely discharge the foreign substances remaining between the purge gas guide tube 310 and the purge gas guide tube support shaft 320.

While the chuck base 110 is rotating, in specific, a pressure around a connected portion between the purge gas guide tube 310 and the purge gas guide tube support shaft 320 becomes decreased to prevent particles in the flow of external air from entering through a minute gap occurring in a coupled structure between the purge gas guide tube 310 and the purge gas guide tube support shaft 320.

In a plan view, further, the chuck base 110 has a bypass path 114 formed on a center of top thereof to communicate with the purge gas outlet hole 112, thereby preventing a negative pressure from being generated from the space S between the chuck base 110 and the substrate W to keep the substrate W from sagging down toward the top of the chuck base 110 or to keep external particles from being collected to the space S.

Further, in a longitudinal sectional view, the chuck base 110 is configured to have an inside part 115 and an outside part 116 with respect to the purge gas outlet hole 112, and in this case, the inside part 115 is lower in height than the outside part 116 (See a reference symbol 't' of FIG. 3). Accordingly, the substrate W can be prevented from sagging down and coming into contact with top of the inside part 115 of the chuck base 110.

Further, the purge gas supply assembly 300 has a tube fitting 380 connected to an open lower end periphery of the purge gas guide tube 310 to connect a tube 370 on which a mass flow controller (MFC) 390 is mounted thereto.

Hereinafter, a method for controlling etching of the substrate edge etching apparatus 1000 to thus adjust an etched amount (width of an etched portion) will be explained with reference to FIGS. 4 to 7.

FIGS. 4 to 7 are graphs showing the numerical values obtained through real tests, and conditions of the tests are indicated on the graphs.

Further, dotted lines are curves that are obtained by linearizing individual values of etched amounts to show total etched amounts.

Firstly, a rotational speed of the substrate support assembly 100 is controlled to adjust an etched amount.

Figure 4:
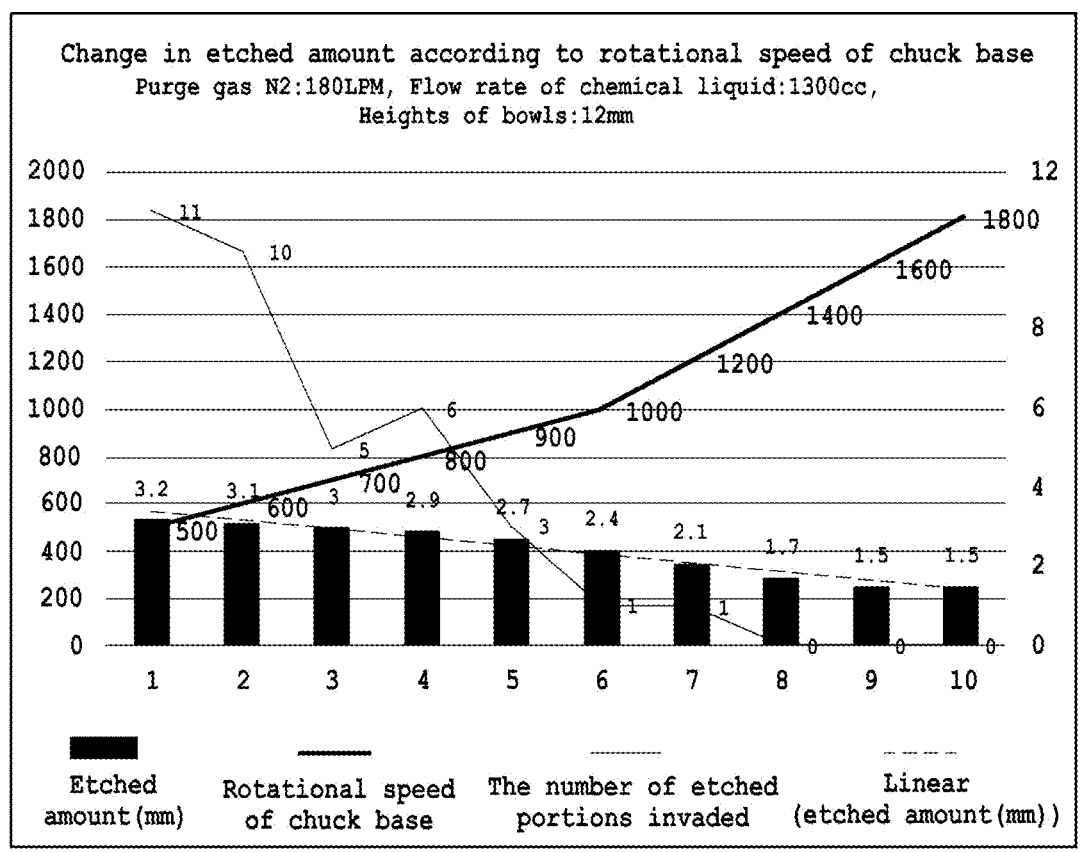
FIG. 4 is a graph showing a relation between a rotational speed of the substrate support assembly and an etched amount according to the present invention.

For example, as shown in FIG. 4, if the rotational speed of the substrate support assembly 100 becomes increased, the etched amount becomes decreased.

In specific, if the rotational speed of the substrate support assembly 100 becomes increased, a centrifugal force applied to the chemical liquid attached to the underside of the substrate W becomes increased to easily overcome the surface tension of the chemical liquid with respect to the substrate W, so that the chemical liquid escapes from the substrate W.

Further, a relation between the rotational speed of the substrate support assembly 100 and the etched amount is obtained on conditions that a flow rate of the purge gas is 180 LPM, a flow rate of the chemical liquid is 1300 cc/min, and a height h to the top of the bowl 710 from the top of the substrate W is 12 mm.

If the etched amount is less than a given reference value, accordingly, the rotational speed of the substrate support assembly 100 is decreased, and contrarily, if the etched amount is more than the given reference value, the rotational speed of the substrate support assembly 100 is increased, so that it is possible that the etched amount can easily correspond to the given reference value.

Secondly, a flow rate of the purge gas supplied from the purge gas supply assembly 300 is controlled to adjust an etched amount.

Figure 5:
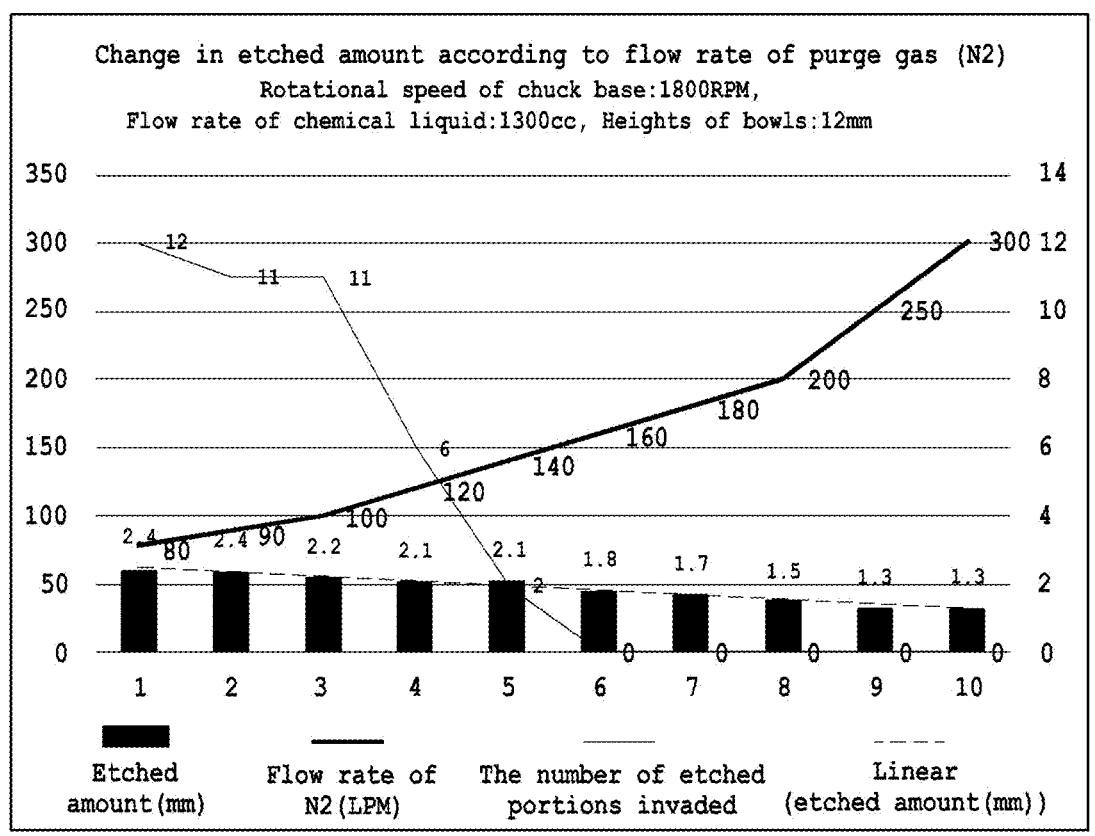
FIG. 5 is a graph showing a relation between a flow rate of a purge gas and an etched amount according to the present invention.

For example, as shown in FIG. 5, if the flow rate of the purge gas becomes increased, the etched amount becomes decreased.

In specific, if the flow rate of the purge gas supplied from the purge gas supply assembly 300 becomes increased, a flow rate of the purge gas passing through the space between the substrate W and the chuck base 110 becomes increased, and accordingly, the chemical liquid attached to the substrate W is moved together with the purge gas passing through the space, so that the surface tension of the chemical liquid with respect to the substrate W can be easily overcome to allow the chemical liquid to escape from the substrate W.

Further, a relation between the flow rate of the purge gas and the etched amount is obtained on conditions that a rotational speed of the substrate support assembly is 1800 RPM, a flow rate of the chemical liquid is 1300 cc/min, and a height h to the top of the bowl 710 from the top of the substrate W is 12 mm.

If the etched amount is less than a given reference value, accordingly, the flow rate of the purge gas is decreased, and contrarily, if the etched amount is more than the given reference value, the flow rate of the purge gas is increased, so that it is possible that the etched amount can easily correspond to the given reference value.

Thirdly, a flow rate of the chemical liquid supplied from the chemical liquid supply unit 600 is controlled to adjust an etched amount.

Figure 6:
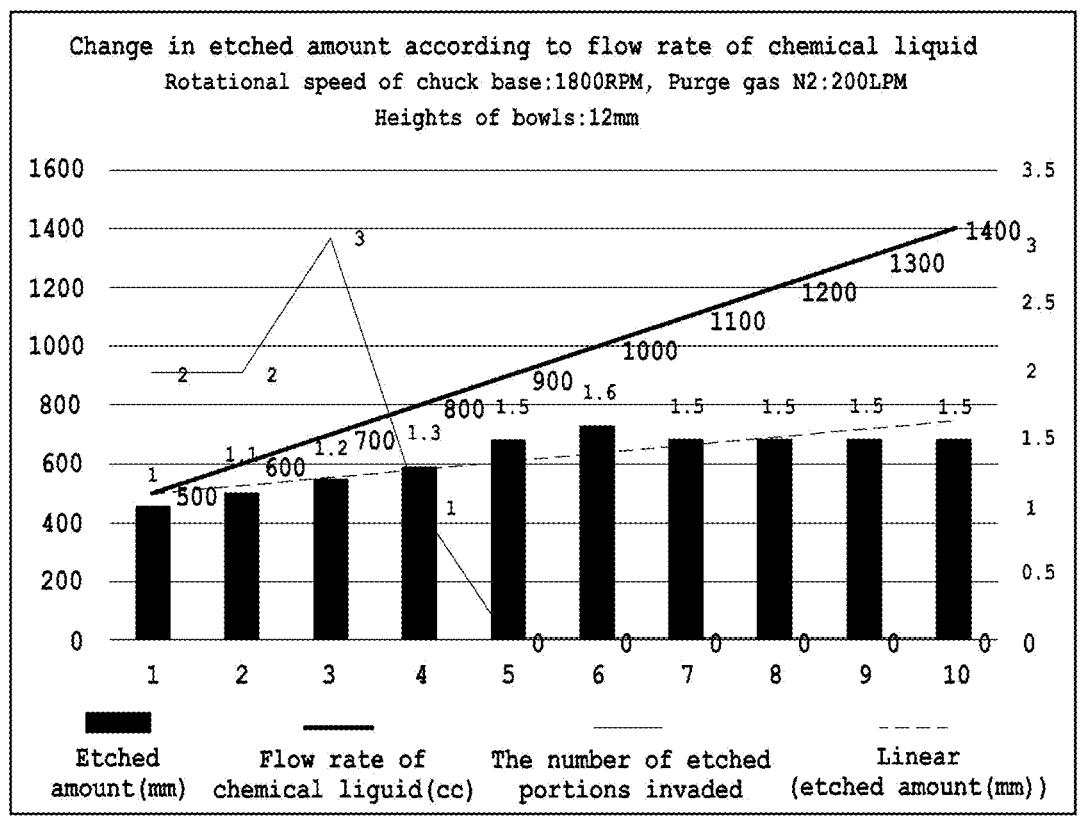
FIG. 6 is a graph showing a relation between a flow rate of a chemical liquid supplied and an etched amount according to the present invention.

For example, as shown in FIG. 6, if the flow rate of the chemical liquid becomes increased, the etched amount becomes increased, but it can be appreciated that there is an appropriate limit value.

In specific, if the flow rate of the chemical liquid supplied from the chemical liquid supply unit 600 becomes increased, an amount of the chemical liquid flowing to the center of the substrate W is increased, thereby additionally generating power for moving the chemical liquid to the inside of the substrate W by means of the surface tension of the chemical liquid. In this case, if the flow rate of the chemical liquid is over a given limit value, the chemical liquid more than the given limit value serves as a remainder that does not act as the power for moving the chemical liquid to the inside of the substrate W anymore.

Further, a relation between the flow rate of the chemical liquid and the etched amount is obtained on conditions that a rotational speed of the substrate support assembly 100 is 1800 RPM, a flow rate of the purge gas is 200 LPM, and a height h to the top of the bowl 710 from the top of the substrate W is 12 mm.

Within the range of the relation between the flow rate of the chemical liquid and the etched amount, accordingly, if the etched amount is less than a given reference value, the flow rate of the chemical liquid is increased, and contrarily, if the etched amount is more than the given reference value, the flow rate of the chemical liquid is decreased, so that it is possible that the etched amount can easily correspond to the given reference value.

Lastly, the height h to the top of the bowl 710 is controlled to adjust a distance between the bowls 710 and the peripheral edge of the substrate W, thereby adjusting an etched amount.

Figure 7:
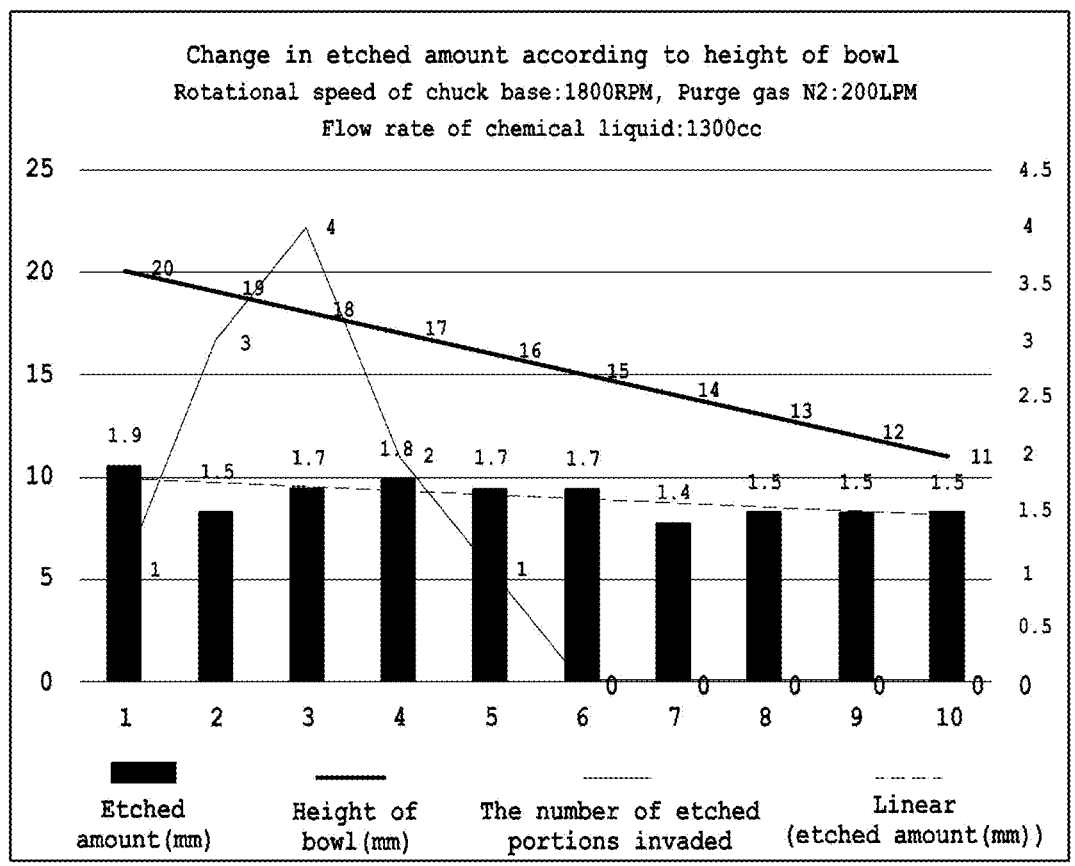
FIG. 7 is a graph showing a relation between heights of bowls and an etched amount according to the present invention.

For example, as shown in FIG. 7, if the distance becomes decreased, the etched amount becomes generally decreased.

In specific, if the distance between the bowls 710 and the peripheral edge of the substrate W is decreased, a flow speed of air supplied from the fan filter unit disposed above the substrate W is increased, and accordingly, a pressure is locally decreased to move the chemical liquid attached to the substrate W together with the air supplied, so that the surface tension of the chemical liquid with respect to the substrate W can be easily overcome to allow the chemical liquid to escape from the substrate W.

As shown in FIG. 2, the distance between the bowls 710 and the peripheral edge of the substrate W is determined according to the adjustment in the height h to the top of the bowl 710 from top of the substrate W, and the higher the bowls 710 are in height, for example, the wider the distance is.

Further, a relation between the height h to the top of the bowl 710 from top of the substrate W and the etched amount is obtained on conditions that a rotational speed of the substrate support assembly is 1800 RPM, a flow rate of the purge gas is 200 LPM, and a flow rate of the chemical liquid is 1300 cc/min.

If the etched amount is less than a given reference value, the height h to the top of the bowl 710 from top of the substrate W is increased to decrease a flow speed of air passing between the bowls 710 and the peripheral edge of the substrate W, and contrarily, if the etched amount is more than the given reference value, the height h to the top of the bowl 710 from top of the substrate W is decreased to increase the flow speed of air, so that it is possible that the etched amount can easily correspond to the given reference value.

Additionally, as shown in FIGS. 4 to 7, the number of etched portions invaded indicates the number of portions invaded radially inside the substrate because the escape force of the chemical liquid is not perfectly balanced with surface tension thereof to thus fail to originate boundaries of the etched portions from the periphery of the underside of the substrate.

While the etched amount is satisfied, desirably, the number of etched portions invaded is kept to zero, but in an unavoidable case, the number of etched portions invaded is limited to maximum two.

As described above, the substrate edge etching apparatus according to the present invention is configured to have the substrate support assembly having the horizontally rotatable chuck base, the chuck pins disposed on top of the chuck base to support the substrate, the purge gas inlet hole extending from the underside center of the chuck base to the interior of the chuck base in the upward and downward direction thereof, and the purge gas outlet hole extending radially from the purge gas inlet hole and then extending upwardly to penetrate top of the chuck base, the purge gas supply assembly for supplying the purge gas to the purge gas inlet hole, the chemical liquid supply unit for supplying the chemical liquid to top of the substrate, a bowl assembly having bowls surrounding the periphery of the substrate support assembly and configured to be able to ascend and descend, and the fan filter unit spaced apart from top of the substrate support assembly, whereby in a state where the substrate is reversely located on the chuck base to allow the treatment surface on which the circuit pattern formation layer is formed to be facingly on top of the chuck base, the chuck base rotates, while the chemical liquid is being supplied to top of the substrate and the purge gas such as nitrogen gas N2 and the like is being supplied to underside of the substrate, and accordingly, a given etched amount can be kept on the peripheral edge of the substrate.

According to the present invention, further, any one or more of the rotational speed of the substrate support assembly, the flow rate of the purge gas supplied from the purge gas supply assembly, the flow rate of the chemical liquid supplied from the chemical liquid supply unit, and the height to the top of the bowl to top of the substrate are controlled to thus adjust the etched amount, so that the method for controlling the etching is easily performed under the simple configuration.

According to the present invention, in addition, any one or more of the rotational speed of the substrate support assembly, the flow rate of the purge gas supplied from the purge gas supply assembly, the flow rate of the chemical liquid supplied from the chemical liquid supply unit, and the height to the top of the bowl to top of the substrate are controlled to thus adjust the number of etched portions invaded unevenly on the periphery of the underside of the substrate.

The present invention may be modified in various ways and may have several exemplary embodiments. It is therefore intended that the scope of the invention be limited not by this detailed description, but rather by the claims appended hereto, and it should be understood that the invention covers all the modifications, equivalents, and replacements within the idea and technical scope of the invention.

What is claimed is:

1. A method for controlling etching of substrate edge using a substrate edge etching apparatus, the substrate edge etching apparatus comprising:

a substrate support assembly having a horizontally rotatable chuck base, chuck pins disposed on top of the chuck base to support a substrate, a purge gas inlet hole extending from an underside center of the chuck base to an interior of the chuck base in an upward and downward direction thereof, and a purge gas outlet hole extending radially and horizontally from the purge gas inlet hole and then extending upwardly to penetrate top of the chuck base near the substrate edge;

a purge gas supply assembly for supplying a purge gas to the purge gas inlet hole;

a chemical liquid supply unit for supplying a chemical liquid to top of the substrate;

a bowl assembly having bowls surrounding the periphery of the substrate support assembly and configured to be able to ascend and descend; and a fan filter unit spaced apart from top of the substrate support assembly, wherein etching of the underside of the substrate is performed while rotating the chuck base in a state where the substrate is reversely located on the chuck base and thereby a treatment surface on which a circuit pattern is formed faces toward the top of the chuck base, wherein while a chemical liquid is supplied to top of the substrate, purge gas introducing from the underside center of the chuck base through the purge gas inlet hole is supplied to underside of the substrate near the substrate edge through the purge gas outlet hole, thereby radial etched width of the peripheral edge of the underside of the substrate is determined by a balance between escape force of the chemical liquid due to supply of the purge gas and surface tension of the chemical liquid, wherein if the etched width is less than a given reference value, the flow rate of the purge gas is decreased, and if the etched width is more than the given reference value, the flow rate of the purge gas is increased, so that the etched width can be adjusted to the given reference value.

2. The method according to claim 1, wherein the etched width is adjusted by a rotational speed of the substrate support assembly.

3. The method according to claim 2, wherein if the etched width is less than the given reference value, the rotational speed of the substrate support assembly is decreased, and if the etched width is more than the given reference value, the rotational speed of the substrate support assembly is increased, so that the etched width corresponds to the given reference value.

* * * * *